United States Patent
Chow et al.

(10) Patent No.: US 8,031,475 B2
(45) Date of Patent: Oct. 4, 2011

(54) INTEGRATED CIRCUIT PACKAGE SYSTEM WITH FLEXIBLE SUBSTRATE AND MOUNDED PACKAGE

(75) Inventors: Seng Guan Chow, Singapore (SG); Il Kwon Shim, Singapore (SG); Byung Joon Han, Singapore (SG); Kambhampati Ramakrishna, Chandler, AZ (US)

(73) Assignee: STATS Chippac, Ltd., Singapore (SG)

( * ) Notice: Subject to any disclaimer, the term of this patent is extended or adjusted under 35 U.S.C. 154(b) by 723 days.

(21) Appl. No.: 12/136,007

(22) Filed: Jun. 9, 2008

(65) Prior Publication Data

US 2009/0016033 A1    Jan. 15, 2009

Related U.S. Application Data

(60) Provisional application No. 60/949,514, filed on Jul. 12, 2007.

(51) Int. Cl.
H05K 1/16 (2006.01)
H05K 1/00 (2006.01)
H01L 23/02 (2006.01)

(52) U.S. Cl. ........ 361/765; 361/749; 361/760; 361/767; 361/770; 361/772; 174/254; 174/255; 257/684; 257/686

(58) Field of Classification Search .............. None
See application file for complete search history.

(56) References Cited

U.S. PATENT DOCUMENTS

| | | |
|---|---|---|
| 5,646,446 A | 7/1997 | Nicewarner, Jr. et al. |
| 6,683,377 B1 | 1/2004 | Shim et al. |
| 6,765,288 B2 | 7/2004 | Damberg |
| 6,841,855 B2 | 1/2005 | Jaeck et al. |
| 6,869,825 B2 * | 3/2005 | Chiu ............................ 438/106 |
| 6,884,653 B2 | 4/2005 | Larson |
| 6,924,551 B2 | 8/2005 | Rumer et al. |
| 6,933,598 B2 | 8/2005 | Karnezos |
| 6,940,729 B2 * | 9/2005 | Cady et al. ..................... 361/767 |
| 6,982,869 B2 | 1/2006 | Larson |
| 7,033,911 B2 | 4/2006 | Manepalli et al. |
| 7,053,478 B2 | 5/2006 | Roper et al. |
| 7,115,986 B2 | 10/2006 | Moon et al. |
| 7,149,095 B2 | 12/2006 | Warner et al. |
| 7,154,171 B1 | 12/2006 | Yoshida |
| 7,154,175 B2 * | 12/2006 | Shrivastava et al. .......... 257/723 |
| 7,183,140 B2 * | 2/2007 | Davison et al. ............... 438/122 |
| 7,205,647 B2 * | 4/2007 | Karnezos ..................... 257/686 |
| 7,230,328 B2 | 6/2007 | Hazeyama et al. |
| 7,235,870 B2 | 6/2007 | Punzalan, Jr. et al. |
| 7,358,444 B2 * | 4/2008 | Nickerson et al. ............ 174/254 |
| 2006/0033217 A1 | 2/2006 | Taggart et al. |
| 2006/0077644 A1 | 4/2006 | Nickerson et al. |
| 2006/0138630 A1 | 6/2006 | Bhakta |
| 2006/0226543 A1 | 10/2006 | Kim et al. |
| 2007/0114649 A1 | 5/2007 | Partridge et al. |
| 2007/0187826 A1 | 8/2007 | Shim et al. |
| 2007/0194423 A1 | 8/2007 | Yim et al. |
| 2007/0194463 A1 | 8/2007 | Kim et al. |
| 2008/0009096 A1 | 1/2008 | Hwang |

(Continued)

*Primary Examiner* — Boris Chervinsky
(74) *Attorney, Agent, or Firm* — Mikio Ishimaru

(57) ABSTRACT

An integrated circuit package system includes: providing a flexible circuit substrate; mounting an integrated circuit or an integrated circuit package over the flexible circuit substrate and connected to the flexible circuit substrate with interconnects; and encapsulating the integrated circuit or integrated circuit package with a mounded encapsulation having a first level and a second level, the second level having the flexible circuit substrate folded thereover.

20 Claims, 9 Drawing Sheets

U.S. PATENT DOCUMENTS

2009/0016032 A1 1/2009 Chow et al.
2009/0206461 A1 8/2009 Yoon
2009/0236753 A1 9/2009 Moon et al.

* cited by examiner

INTEGRATED CIRCUIT PACKAGE SYSTEM WITH FLEXIBLE SUBSTRATE AND MOUNDED PACKAGE

CROSS-REFERENCE TO RELATED APPLICATION(S)

This application claims the benefit of U.S. Provisional Patent Application Ser. No. 60/949,514 filed on Jul. 12, 2007, and the subject matter thereof is hereby incorporated herein by reference thereto.

The present application contains subject matter related to a concurrently filed U.S. Patent Application by Seng Guan Chow, Il Kwon Shim, Byung Joon Han, and Kambhampati Ramakrishna entitled "INTEGRATED CIRCUIT PACKAGE SYSTEM WITH FLEXIBLE SUBSTRATE AND RECESSED PACKAGE". The related application is assigned to STATS ChipPAC Ltd. and is identified by 12/136,002.

TECHNICAL FIELD

The present invention relates generally to integrated circuits, and more particularly to an integrated circuit package system employing multi-package module techniques.

BACKGROUND ART

The rapidly growing portable electronics market, e.g. cellular phones, laptop computers, and PDAs, are an integral facet of modern life. The multitude of portable devices represents one of the largest potential market opportunities for next generation packaging. These devices have unique attributes that have significant impacts on manufacturing integration, in that they must be generally small, lightweight, and rich in functionality and they must be produced in high volumes at relatively low cost.

As an extension of the semiconductor industry, the electronics packaging industry has witnessed ever-increasing commercial competitive pressures, along with growing consumer expectations and the diminishing opportunities for meaningful product differentiation in the marketplace.

Packaging and materials engineering and development are at the very core of these next generation electronics insertion strategies outlined in road maps for development of next generation products. Future electronic systems may be more intelligent, have higher density, use less power, operate at higher speed, and may include mixed technology devices and assembly structures at lower cost than today.

Current packaging suppliers are struggling to accommodate the high-speed computer devices that are projected to exceed one TeraHertz (THz) in the near future. The current technologies, materials, equipment, and structures offer challenges to the basic assembly of these new devices while still not adequately addressing cooling and reliability concerns.

The envelope of technical capability of next level interconnect assemblies are not yet known, and no clear cost effective technology has yet been identified. Beyond the performance requirements of next generation devices, the industry now demands that cost be a primary product differentiator in an attempt to meet profit goals.

As a result, the road maps are driving electronics packaging to precision, ultra miniature form factors, which require automation in order to achieve acceptable yield. These challenges demand not only automation of manufacturing, but also the automation of data flow and information to the production manager and customer.

There have been many approaches to addressing the advanced packaging requirements of microprocessors and portable electronics with successive generations of semiconductors. Many industry road maps have identified significant gaps between the current semiconductor capability and the available supporting electronic packaging technologies. The limitations and issues with current technologies include increasing clock rates, EMI radiation, thermal loads, second level assembly reliability stresses and cost.

As these package systems evolve to incorporate more components with varied environmental needs, the pressure to push the technological envelope becomes increasingly challenging. More significantly, with the ever-increasing complexity, the potential risk of error increases greatly during manufacture.

In view of the ever-increasing commercial competitive pressures, along with growing consumer expectations and the diminishing opportunities for meaningful product differentiation in the marketplace, it is critical that answers be found for these problems. Additionally, the need to reduce costs, reduce production time, improve efficiencies and performance, and meet competitive pressures, adds an even greater urgency to the critical necessity for finding answers to these problems.

Thus, a need remains for smaller footprints and more robust packages and methods for manufacture. Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including: providing a flexible circuit substrate; mounting an integrated circuit or an integrated circuit package over the flexible circuit substrate and connected to the flexible circuit substrate with interconnects; and encapsulating the integrated circuit or integrated circuit package with a mounded encapsulation having a first level and a second level, the second level having the flexible circuit substrate folded thereover.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
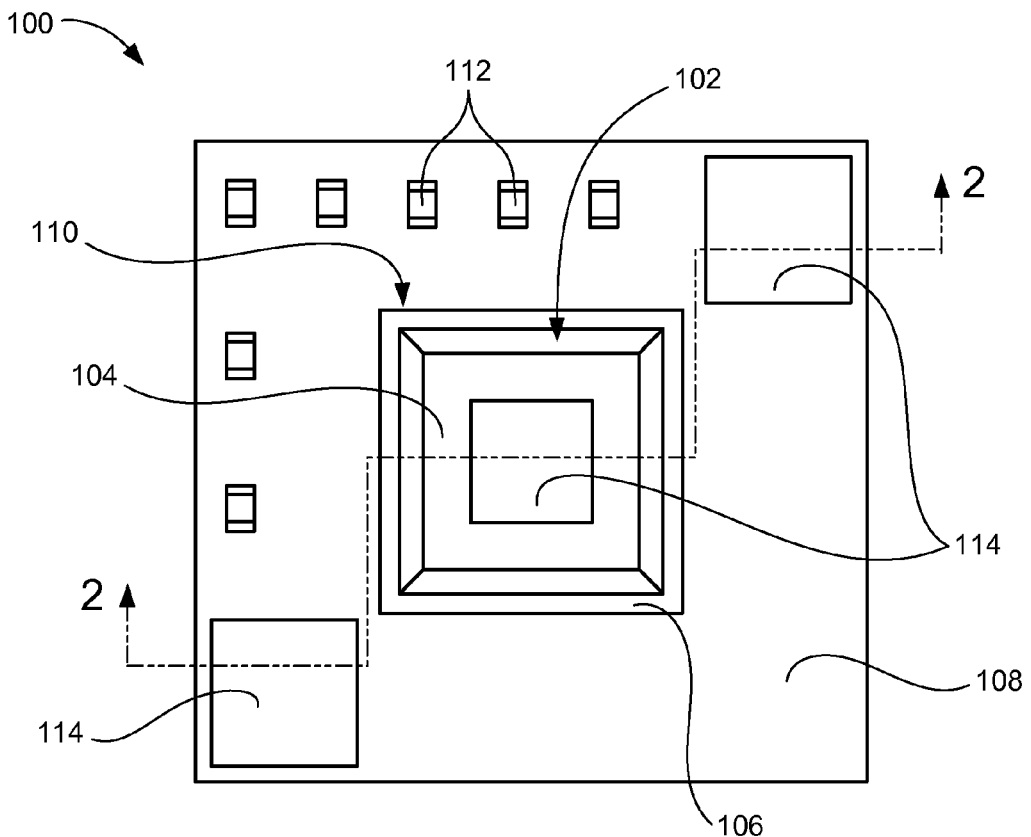
FIG. 1 is a plan view of an integrated circuit package system in accordance with a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown greatly exaggerated in the drawing FIGs. The same numbers are used in all the drawing FIGs. to relate to the same elements.

For expository purposes, the term "horizontal" as used herein is defined as a plane parallel to the plane or surface of the substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means that there is direct contact among elements.

The term "processing" as used herein includes deposition of material or photoresist, patterning, exposure, develop-ment, etching, cleaning, and/or removal of the material or photoresist as required in forming a described structure.

The term "system" as used herein refers to and is defined as the method and as the apparatus of the present invention in accordance with the context in which the term is used. The embodiments have been numbered first embodiment, second embodiment, etc. as a matter of descriptive convenience and are not intended to have any other significance or provide limitations for the present invention.

Referring now to FIG. 1, therein is shown a plan view of an integrated circuit package system 100 in accordance with a first embodiment of the present invention. The integrated circuit package system 100 is shown having a mounded encapsulation 102.

The mounded encapsulation 102 has two distinct levels, such as a first level 104 and a second level 106. Above the second level 106 of the mounded encapsulation 102 is a flexible circuit substrate 108, with a substrate window 110.

The flexible circuit substrate 108 comprises at least one flexible insulating layer, such as: polyimide (PI), polyester, polyethylene napthalate (PEN), Teflon, polyethylene terephthalate (PET), or other polymeric materials.

The flexible circuit substrate 108 also comprises at least one flexible electrically conductive layer such as copper, aluminum, or metallic alloy. The flexible electrically conductive layer provides electrical connections between vias and various interconnects. Above the flexible circuit substrate 108 are mounted passive components 112.

Further, above the flexible circuit substrate 108 and the first level 104 of the mounded encapsulation 102 are mounted integrated circuit (IC) packages 114 which may be a wafer level chip scale package (WLCSP), redistributed line (RDL) die, area array package, leadless package, leaded package, system-in-package (SiP), stacked die package, package-in-package (PiP), etc.

Figure 2:
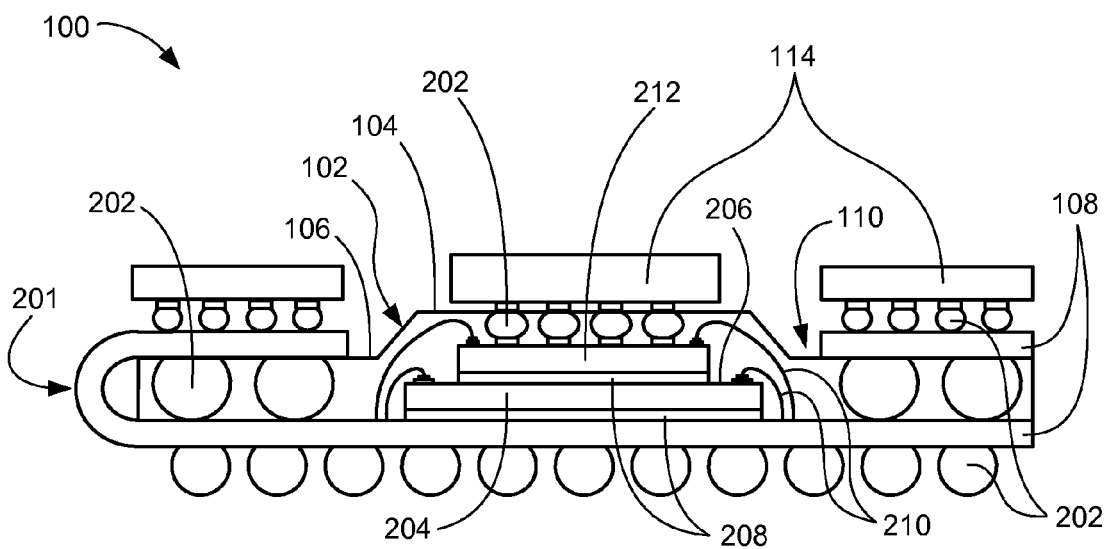
FIG. 2 is a cross-sectional view of the integrated circuit package system along the line 2-2 of FIG. 1.

Referring now to FIG. 2, therein is shown a cross-sectional view of the integrated circuit package system 100 along the line 2-2 of FIG. 1. The integrated circuit package system 100 is shown having the flexible circuit substrate 108 with a single fold 201 folded over the second level 106 of the mounded encapsulation 102.

The first level 104 of the mounded encapsulation 102 is shown in the substrate window 110. The flexible circuit substrate 108 directly contacts the second level 106 of the mounded encapsulation 102 and is sufficiently supported by the second level 106. The second level 106 of the mounded encapsulation 102 comprises internal interconnects such as solder ball interconnects 202.

The solder ball interconnects 202 are partially exposed to provide electrical connection through the second level 106 of the mounded encapsulation 102. Mounted above the second level 106 and above the first level 104 of the mounded encapsulation 102 are the IC packages 114. The IC packages 114 are mounted above the flexible circuit substrate 108 and the second level 106 of the mounded encapsulation 102.

The IC packages 114 above the second level 106 are connected to the flexible circuit substrate 108 with the solder ball interconnects 202 in a ball grid array (BGA) configuration. Beneath the first level 104 of the mounded encapsulation 102 a wire-bonded die 204 with an active side 206 is attached to the flexible circuit substrate 108 with a die attach adhesive 208.

The active side 206 of the wire-bonded die 204 is connected to the flexible circuit substrate 108 by interconnects such as bond wires 210. Mounted above the wire-bonded die 204 is an IC package 212 such as a wafer level chip scale package (WLCSP), a redistributed line (RDL) die, or an area array package.

The IC package 212 is connected to the flexible circuit substrate 108 by the bond wires 210. The IC package 212 is connected with the solder ball interconnects 202 to the IC package 114 mounted above the first level 104 of the mounded encapsulation 102.

The mounded encapsulation 102 can serve as an under-fill material that can structurally reinforce the solder ball interconnects 202 in the second level 106 and above the IC package 212 and improve the fatigue life and reliability.

Mounted below the flexible circuit substrate 108 are external interconnects, such as the solder ball interconnects 202.

Figure 3:
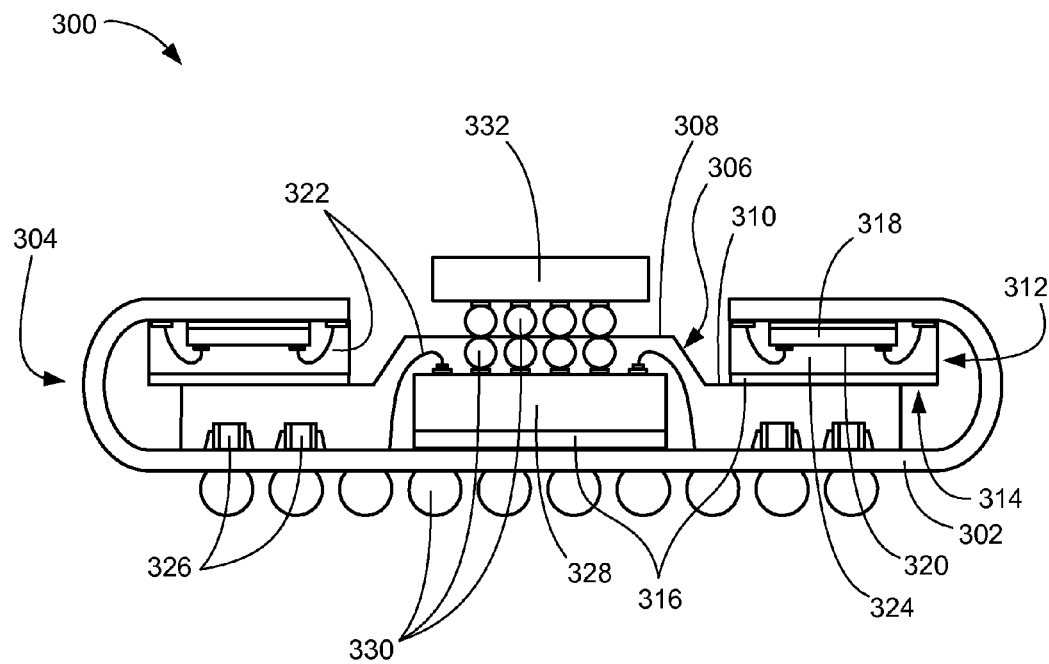
FIG. 3 is a cross-sectional view of an integrated circuit package system in accordance with a second embodiment of the present invention.

Referring now to FIG. 3, therein is shown a cross-sectional view of an integrated circuit package system 300 in accordance with a second embodiment of the present invention. The integrated circuit package system 300 is shown having a flexible circuit substrate 302 with two folds 304 folded around a mounded encapsulation 306.

The flexible circuit substrate 302 comprises at least one flexible insulating layer, such as: polyimide (PI), polyester, polyethylene napthalate (PEN), Teflon, polyethylene terephthalate (PET), or other polymeric materials. The flexible circuit substrate 302 also comprises at least one flexible conductive layer such as copper, aluminum, or metallic alloy. The flexible electrically conductive layer provides electrical connections between vias and various interconnects.

The mounded encapsulation 306 has a first level 308 and a second level 310. The flexible circuit substrate 302 is folded around the second level 310 of the mounded encapsulation 306. Between the flexible circuit substrate 302 and the second level 310, IC packages 312 are mounted face down and may be mounted with an overhang 314.

The IC packages 312 may be replaced with a wafer level chip scale package (WLCSP), redistributed line (RDL) die, area array package, leadless package, leaded package, system-in-package (SiP), stacked die package, package-in-package (PiP), etc.

The flexible circuit substrate 302 is sufficiently supported by the second level 310 and the IC packages 312. The IC packages 312 are attached to the second level 310 with a die attach adhesive 316.

Internally, the IC packages 312 include a wire-bonded die 318 with an active side 320. The active side 320 is facing toward the second level 310 of the mounded encapsulation 306 and is connected to the flexible circuit substrate 302 with interconnects such as bond wires 322.

The wire-bonded die 318 is attached to the flexible circuit substrate 302 with the die attach adhesive 316. An encapsulation 324 encapsulates the wire-bonded die 318 and the bond wires 322.

The second level 310 of the mounded encapsulation 306 comprises passive components 326 but may be replaced with a thin die or a low profile package. Beneath the first level 308 of the mounded encapsulation 306 an IC package 328 is attached to the flexible circuit substrate 302 with the die attach adhesive 316.

The IC package 328 is connected from above to the flexible circuit substrate 302 with the bond wires 322. The IC package 328 is further connected from above with solder ball interconnects 330.

The solder ball interconnects 330 are exposed on the first level 308 of the mounded encapsulation 306. The mounded encapsulation 306 can serve as an under-fill material that can structurally reinforce the solder ball interconnects 330 to improve the fatigue life and reliability.

Mounted above the first level 308 is an IC such as a flip chip (FC) 332 but may also be a wafer level chip scale package (WLCSP), a redistributed line (RDL) die, or an area array package.

The FC 332 is connected with the solder ball interconnects 330 to the first level 308 of the mounded encapsulation 306 and to the solder ball interconnects 330 above the IC package 328. Mounted below the flexible circuit substrate 302 are external interconnects, such as the solder ball interconnects 330.

Figure 4:
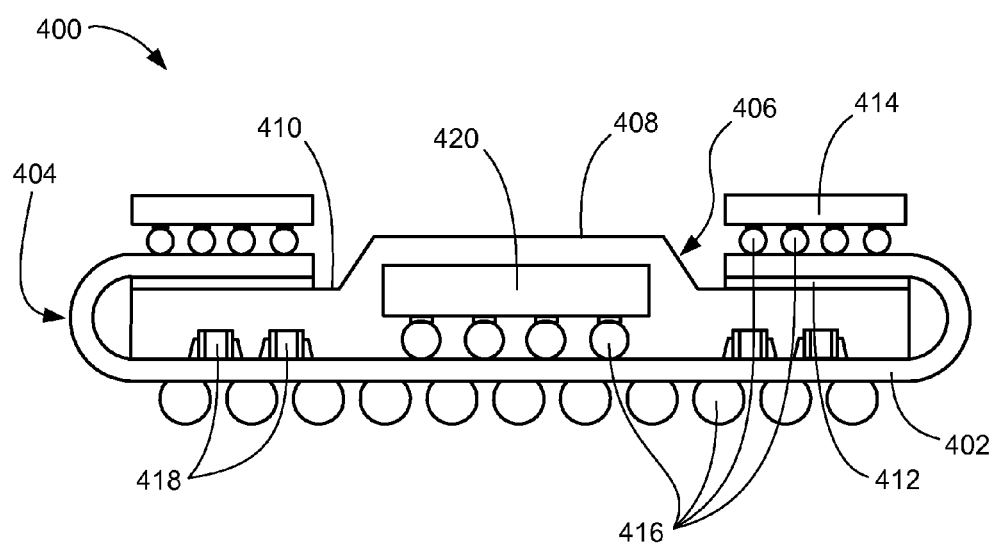
FIG. 4 is a cross-sectional view of an integrated circuit package system in accordance with a third embodiment of the present invention.

Referring now to FIG. 4, therein is shown a cross-sectional view of an integrated circuit package system 400 in accordance with a third embodiment of the present invention. The integrated circuit package system 400 is shown having a flexible circuit substrate 402 with two folds 404 folded around a mounded encapsulation 406.

The flexible circuit substrate 402 comprises at least one flexible insulating layer, such as: polyimide (PI), polyester, polyethylene napthalate (PEN), Teflon, polyethylene terephthalate (PET), or other polymeric materials. The flexible circuit substrate 402 also comprises at least one flexible conductive layer such as copper, aluminum, or metallic alloy. The flexible electrically conductive layer provides electrical connections between vias and various interconnects.

The mounded encapsulation 406 has a first level 408 and a second level 410. The flexible circuit substrate 402 is folded around the second level 410 of the mounded encapsulation 406.

The flexible circuit substrate 402 is attached to the second level 410 with a die attach adhesive 412. The flexible circuit substrate 402 is sufficiently supported by the second level 410. Above the second level 410 integrated circuits, such as a FCs 414 are connected to the flexible circuit substrate 402 with interconnects such as solder ball interconnects 416.

The FCs 414 may be replaced with IC packages such as wafer level chip scale package (WLCSP), redistributed line (RDL) die, area array package, leadless package, leaded package, system-in-package (SiP), stacked die package, package-in-package (PiP), etc.

The second level 410 of the mounded encapsulation 406 comprises passive components 418 but may be replaced with a thin die or a low profile package. Beneath the first level 408 of the mounded encapsulation 406 an IC 420, such as a flip chip (FC), is attached to the flexible circuit substrate 402 with the solder ball interconnects 416.

The mounded encapsulation 406 can serve as an under-fill material that can structurally reinforce the solder ball interconnects 416 to improve the fatigue life and reliability. Mounted below the flexible circuit substrate 402 are external interconnects, such as the solder ball interconnects 416.

Figure 5:
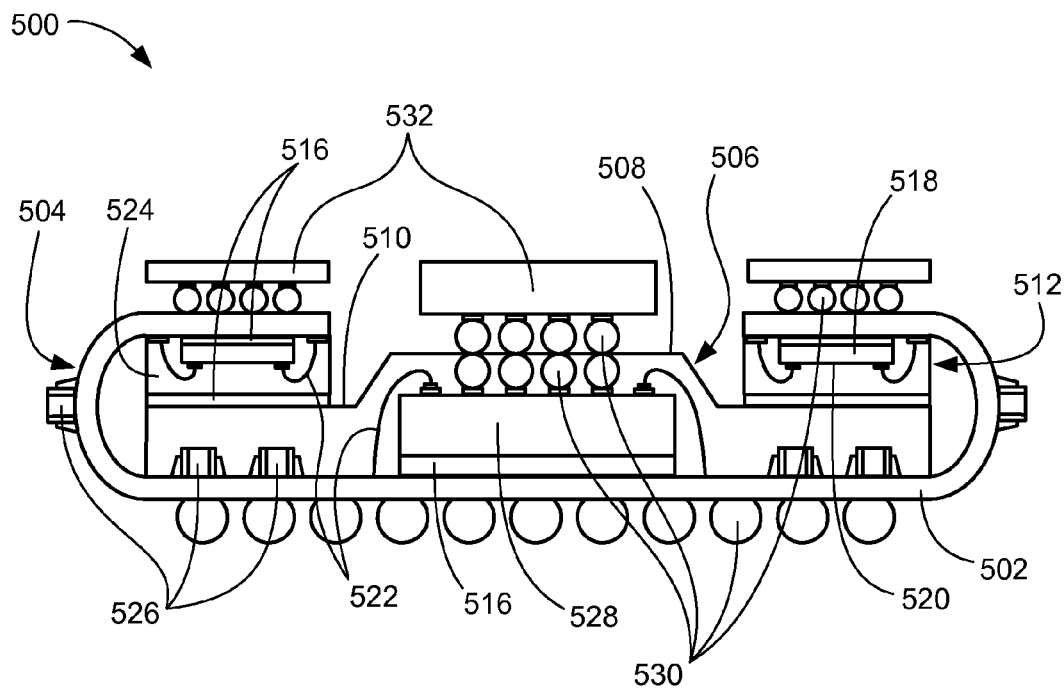
FIG. 5 is a cross-sectional view of an integrated circuit package system in accordance with a fourth embodiment of the present invention.

Referring now to FIG. 5, therein is shown a cross-sectional view of an integrated circuit package system 500 in accordance with a fourth embodiment of the present invention. The integrated circuit package system 500 is shown having a flexible circuit substrate 502 with two folds 504 folded around a mounded encapsulation 506.

The flexible circuit substrate 502 comprises at least one flexible insulating layer, such as: polyimide (PI), polyester, polyethylene napthalate (PEN), Teflon, polyethylene terephthalate (PET), or other polymeric materials. The flexible circuit substrate 502 also comprises at least one flexible conductive layer such as copper, aluminum, or metallic alloy. The flexible electrically conductive layer provides electrical connections between vias and various interconnects.

The mounded encapsulation 506 has a first level 508 and a second level 510. The flexible circuit substrate 502 is folded around the second level 510 of the mounded encapsulation 506. Between the flexible circuit substrate 502 and the second level 510, IC packages 512 are mounted face down and may be mounted with an overhang.

The IC packages 512 may be replaced with a wafer level chip scale package (WLCSP), redistributed line (RDL) die, area array package, leadless package, leaded package, system-in-package (SiP), stacked die package, package-in-package (PiP), etc.

The flexible circuit substrate 502 is sufficiently supported by the second level 510 and the IC packages 512. The IC packages 512 are attached to the second level 510 with a die attach adhesive 516.

Internally, the IC packages 512 include a wire-bonded die 518 with an active side 520. The active side 520 is facing toward the second level 510 of the mounded encapsulation 506 and is connected to the flexible circuit substrate 502 with interconnects such as bond wires 522.

The wire-bonded die 518 is attached to the flexible circuit substrate 502 with the die attach adhesive 516. An encapsulation 524 encapsulates the wire-bonded die 518 and the bond wires 522.

The second level 510 of the mounded encapsulation 506 comprises passive components 526 but may be replaced with a thin die or a low profile package. The passive components 526 may also be mounted on the two folds 504. Beneath the first level 508 of the mounded encapsulation 506 an IC package 528 is attached to the flexible circuit substrate 502 with the die attach adhesive 516.

The IC package 528 is connected from above to the flexible circuit substrate 502 with the bond wires 522. The IC package 528 is further connected from above with interconnects such as solder ball interconnects 530.

The solder ball interconnects 530 are exposed on the first level 508 of the mounded encapsulation 506. The mounded encapsulation 506 can serve as an under-fill material that can structurally reinforce the solder ball interconnects 530 to improve the fatigue life and reliability.

Mounted above the first level 508 is one of three ICs such as a flip chips (FCs) 532 but may also be a wafer level chip scale package (WLCSP), a redistributed line (RDL) die, or an area array package.

The FCs 532 are connected with the solder ball interconnects 530 to the first level 508 of the mounded encapsulation 506 and to the solder ball interconnects 530 above the IC package 528.

Mounted over the second level 510 of the mounded encapsulation 506 and above the flexible circuit substrate 502 are two more FC's 532. The FCs 532 mounted over the second level 510 are connected to the flexible circuit substrate 502 with the solder ball interconnects 530.

The FCs 532 may be replaced with a wafer level chip scale package (WLCSP), redistributed line (RDL) die, area array package, leadless package, leaded package, system-in-package (SiP), stacked die package, package-in-package (PiP), etc. Mounted below the flexible circuit substrate 502 are external interconnects, such as the solder ball interconnects 530.

Figure 6:
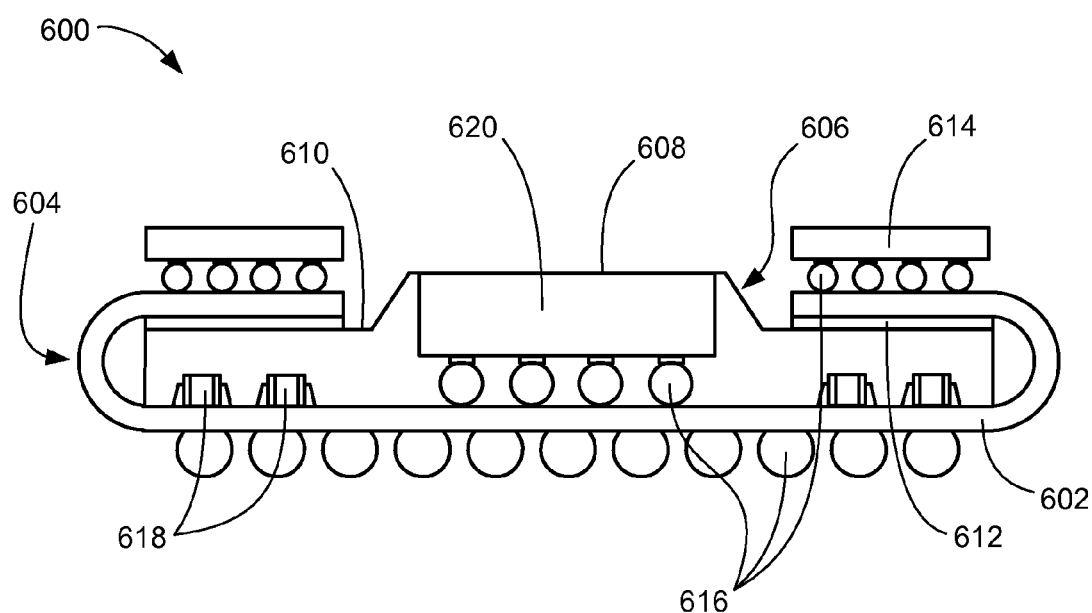
FIG. 6 is a cross-sectional view of an integrated circuit package system in accordance with a fifth embodiment of the present invention.

Referring now to FIG. 6, therein is shown a cross-sectional view of an integrated circuit package system 600 in accordance with a fifth embodiment of the present invention. The integrated circuit package system 600 is shown having a flexible circuit substrate 602 with two folds 604 folded around a mounded encapsulation 606.

The flexible circuit substrate 602 comprises at least one flexible insulating layer, such as: polyimide (PI), polyester, polyethylene napthalate (PEN), Teflon, polyethylene terephthalate (PET), or other polymeric materials. The flexible circuit substrate 602 also comprises at least one flexible conductive layer such as copper, aluminum, or metallic alloy. The flexible electrically conductive layer provides electrical connections between vias and various interconnects.

The mounded encapsulation 606 has a first level 608 and a second level 610. The flexible circuit substrate 602 is folded around the second level 610 of the mounded encapsulation 606.

The flexible circuit substrate 602 is attached to the second level 610 with a die attach adhesive 612. The flexible circuit substrate 602 is sufficiently supported by the second level 610. Above the second level 610 integrated circuits, such as a FCs 614 are connected to the flexible circuit substrate 602 with interconnects such as solder ball interconnects 616.

The FCs 614 may be replaced with IC packages such as wafer level chip scale package (WLCSP), redistributed line (RDL) die, area array package, leadless package, leaded package, system-in-package (SiP), stacked die package, package-in-package (PiP), etc.

The second level 610 of the mounded encapsulation 606 comprises passive components 618 but may be replaced with a thin die or a low profile package. Beneath the first level 608 of the mounded encapsulation 606 an IC 620, such as a FC, is attached to the flexible circuit substrate 602 with the solder ball interconnects 616.

The mounded encapsulation 606 can serve as an under-fill material that can structurally reinforce the solder ball interconnects 616 to improve the fatigue life and reliability. The IC 620 is exposed from the first level 608 of the mounded encapsulation 606. Mounted below the flexible circuit substrate 602 are external interconnects, such as the solder ball interconnects 616.

Figure 7:
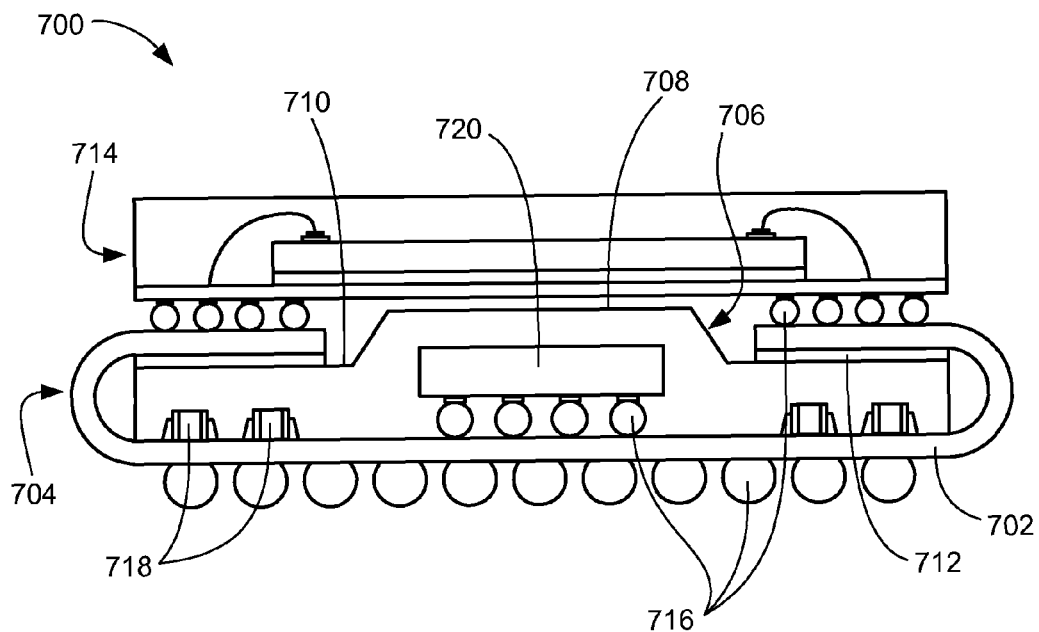
FIG. 7 is a cross-sectional view of an integrated circuit package system in accordance with a sixth embodiment of the present invention.

Referring now to FIG. 7, therein is shown a cross-sectional view of an integrated circuit package system 700 in accordance with a sixth embodiment of the present invention. The integrated circuit package system 700 is shown having a flexible circuit substrate 702 with two folds 704 folded around a mounded encapsulation 706.

The flexible circuit substrate 702 comprises at least one flexible insulating layer, such as: polyimide (PI), polyester, polyethylene napthalate (PEN), Teflon, polyethylene terephthalate (PET), or other polymeric materials. The flexible circuit substrate 702 also comprises at least one flexible conductive layer such as copper, aluminum, or metallic alloy. The flexible electrically conductive layer provides electrical connections between vias and various interconnects.

The mounded encapsulation 706 has a first level 708 and a second level 710. The flexible circuit substrate 702 is folded around the second level 710 of the mounded encapsulation 706. The flexible circuit substrate 702 is attached to the second level 710 with a die attach adhesive 712. The flexible circuit substrate 702 is sufficiently supported by the second level 710.

Bridging the mounded encapsulation 706 is an integrated circuit package 714. The integrated circuit package 714 is connected to the flexible circuit substrate 702 with interconnects such as solder ball interconnects 716 such as fine pitch solder balls with a diameter of 0.5 mm or less.

The second level 710 of the mounded encapsulation 706 comprises passive components 718 but may be replaced with a thin die or a low profile package. Beneath the first level 708 of the mounded encapsulation 706 an IC 720, such as a FC, is attached to the flexible circuit substrate 702 with the solder ball interconnects 716.

The mounded encapsulation 706 can serve as an under-fill material that can structurally reinforce the solder ball interconnects 716 to improve the fatigue life and reliability.

Mounted below the flexible circuit substrate 702 are external interconnects, such as the solder ball interconnects 716.

Figure 8:
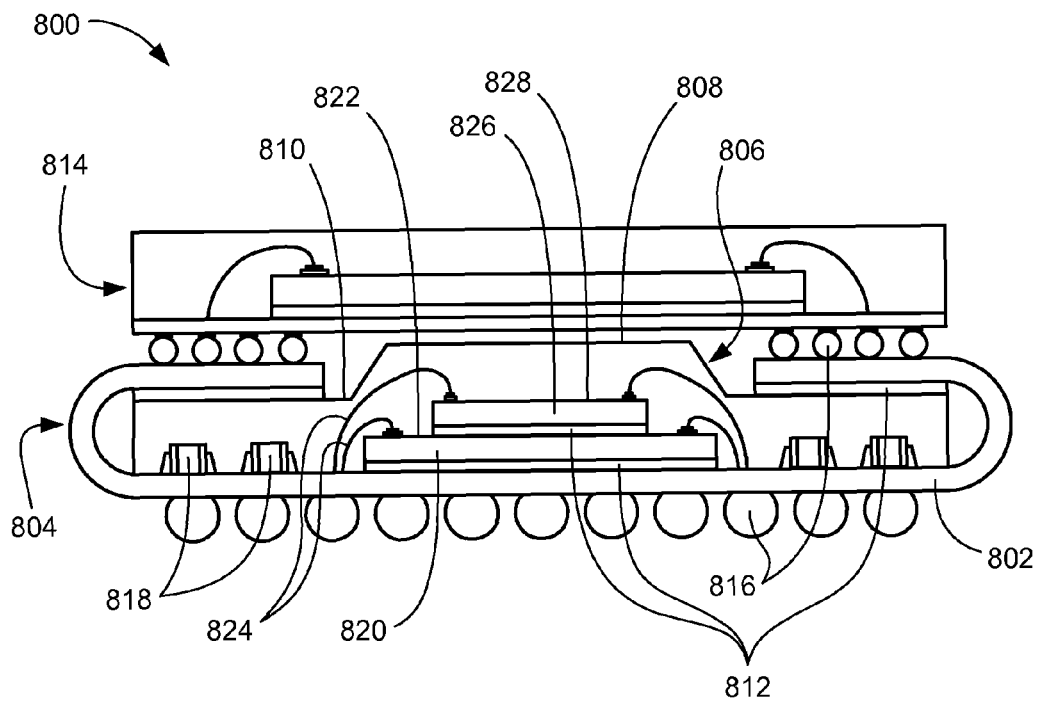
FIG. 8 is a cross-sectional view of an integrated circuit package system in accordance with a seventh embodiment of the present invention.

Referring now to FIG. 8, therein is shown a cross-sectional view of an integrated circuit package system 800 in accordance with a seventh embodiment of the present invention. The integrated circuit package system 800 is shown having a flexible circuit substrate 802 with two folds 804 folded around a mounded encapsulation 806.

The flexible circuit substrate 802 comprises at least one flexible insulating layer, such as: polyimide (PI), polyester, polyethylene napthalate (PEN), Teflon, polyethylene terephthalate (PET), or other polymeric materials. The flexible circuit substrate 802 also comprises at least one flexible conductive layer such as copper, aluminum, or metallic alloy. The flexible electrically conductive layer provides electrical connections between vias and various interconnects.

The mounded encapsulation 806 has a first level 808 and a second level 810. The flexible circuit substrate 802 is folded around the second level 810 of the mounded encapsulation 806. The flexible circuit substrate 802 is attached to the second level 810 with a die attach adhesive 812. The flexible circuit substrate 802 is sufficiently supported by the second level 810.

Bridging the mounded encapsulation 806 is an integrated circuit package 814. The integrated circuit package 814 is connected to the flexible circuit substrate 802 with interconnects such as solder ball interconnects 816 such as fine pitch solder balls with a diameter of 0.5 mm or less.

The second level 810 of the mounded encapsulation 806 comprises passive components 818 but may be replaced with a thin die or a low profile package. Beneath the first level 808 of the mounded encapsulation 806 a first IC, such as a first wire-bonded die 820 with an active side 822 is attached to the flexible circuit substrate 802 with the die attach adhesive 812.

The active side 822 of the first wire-bonded die 820 is connected to the flexible circuit substrate 802 with interconnects such as bond wires 824. Above the first wire-bonded die 820 is mounted a second IC, such as a second wire-bonded die 826 with an active side 828.

The active side 828 of the second wire-bonded die 826 is connected to the flexible circuit substrate 802 with the bond wires 824. Mounted below the flexible circuit substrate 802 are external interconnects, such as the solder ball interconnects 816.

Figure 9:
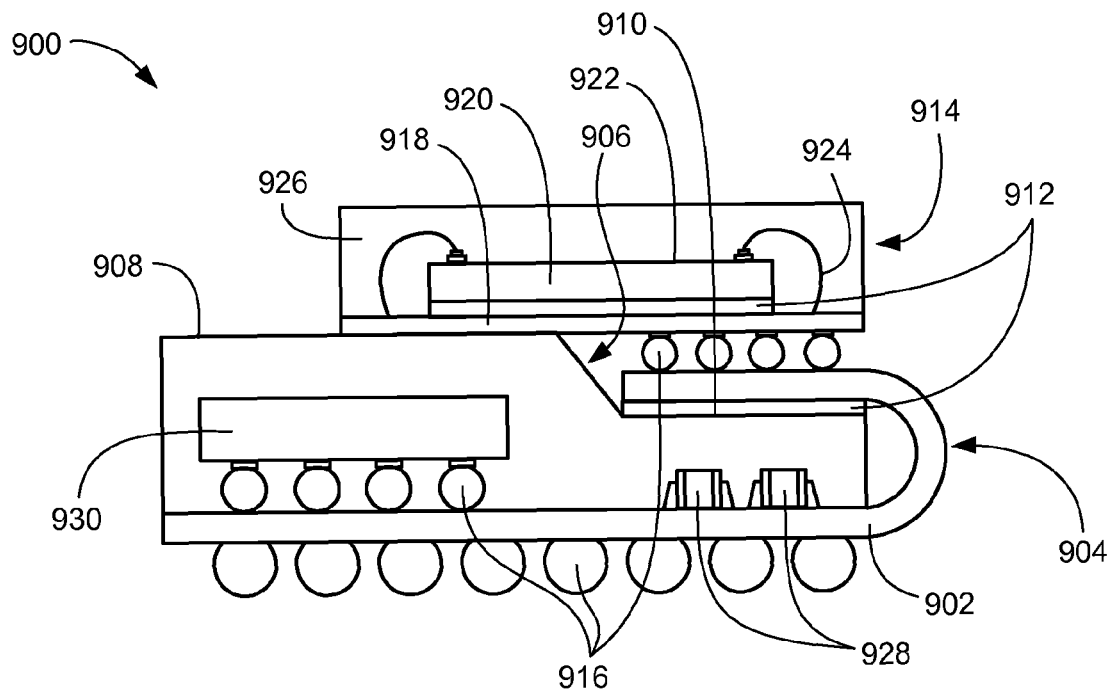
FIG. 9 is a cross-sectional view of an integrated circuit package system in accordance with an eighth embodiment of the present invention.

Referring now to FIG. 9, therein is shown a cross-sectional view of an integrated circuit package system 900 in accordance with an eighth embodiment of the present invention. The integrated circuit package system 900 is shown having a flexible circuit substrate 902 with a single fold 904 folded around a mounded encapsulation 906.

The flexible circuit substrate 902 comprises at least one flexible insulating layer, such as: polyimide (PI), polyester, polyethylene napthalate (PEN), Teflon, polyethylene terephthalate (PET), or other polymeric materials. The flexible circuit substrate 902 also comprises at least one flexible conductive layer such as copper, aluminum, or metallic alloy. The flexible electrically conductive layer provides electrical connections between vias and various interconnects.

The mounded encapsulation 906 has a first level 908 that is offset and a second level 910. The flexible circuit substrate 902 is folded around the second level 910 of the mounded encapsulation 906. The flexible circuit substrate 902 is attached to the second level 910 with a die attach adhesive 912. The flexible circuit substrate 902 is sufficiently supported by the second level 910.

Above the second level 910 an integrated circuit package 914 is connected to the flexible circuit substrate 902 with interconnects such as solder ball interconnects 916. The integrated circuit package 914 comprises a substrate 918.

Mounted above the substrate 918 is a wire-bonded die 920 with an active side 922. The active side 922 is connected to the substrate 918 with interconnects such as bond wires 924. The wire-bonded die 920 is attached to the substrate 918 with the die attach adhesive 912. Encapsulating the wire-bonded die 920 is an encapsulation 926. The substrate 918 of the integrated circuit package 914 contacts the first level 908 of the mounded encapsulation 906.

The second level 910 of the mounded encapsulation 906 comprises passive components 928 but may be replaced with a thin die or a low profile package. Beneath the first level 908 of the mounded encapsulation 906 an IC 930, such as a FC, is attached to the flexible circuit substrate 902 with the solder ball interconnects 916.

The mounded encapsulation 906 can serve as an under-fill material that can structurally reinforce the solder ball interconnects 916 to improve the fatigue life and reliability. Mounted below the flexible circuit substrate 902 are external interconnects, such as the solder ball interconnects 916.

Figure 10:
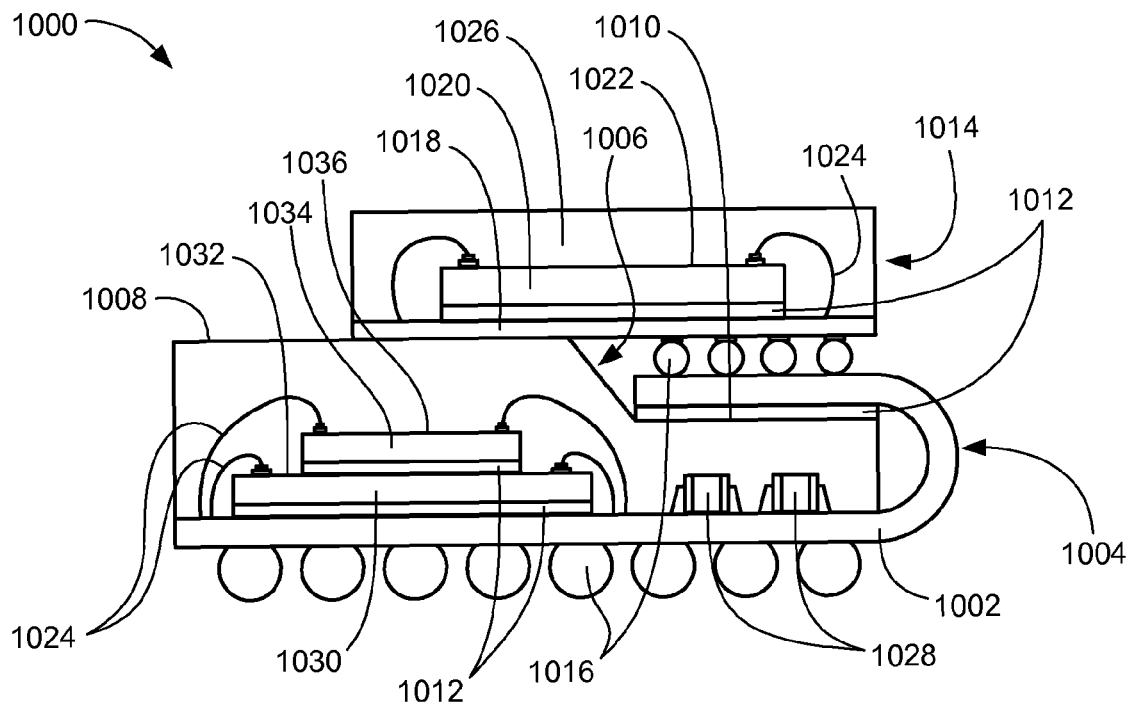
FIG. 10 is a cross-sectional view of an integrated circuit package system in accordance with a ninth embodiment of the present invention.

Referring now to FIG. 10, therein is shown a cross-sectional view of an integrated circuit package system 1000 in accordance with a ninth embodiment of the present invention. The integrated circuit package system 1000 is shown having a flexible circuit substrate 1002 with a single fold 1004 folded around a mounded encapsulation 1006.

The flexible circuit substrate 1002 comprises at least one flexible insulating layer, such as: polyimide (PI), polyester, polyethylene napthalate (PEN), Teflon, polyethylene terephthalate (PET), or other polymeric materials. The flexible circuit substrate 1002 also comprises at least one flexible conductive layer such as copper, aluminum, or metallic alloy. The flexible electrically conductive layer provides electrical connections between vias and various interconnects.

The mounded encapsulation 1006 has a first level 1008 that is offset and a second level 1010. The flexible circuit substrate 1002 is folded around the second level 1010 of the mounded encapsulation 1006.

The flexible circuit substrate 1002 is attached to the second level 1010 with a die attach adhesive 1012. The flexible circuit substrate 1002 is sufficiently supported by the second level 1010.

Above the second level 1010 an integrated circuit package 1014 is connected to the flexible circuit substrate 1002 with interconnects such as solder ball interconnects 1016. The integrated circuit package 1014 comprises a substrate 1018.

Mounted above the substrate 1018 is a wire-bonded die 1020 with an active side 1022. The active side 1022 is connected to the substrate 1018 with bond wires 1024. The wire-bonded die 1020 is attached to the substrate 1018 with the die attach adhesive 1012.

Encapsulating the wire-bonded die 1020 is an encapsulation 1026. The substrate 1018 of the integrated circuit package 1014 contacts the first level 1008 of the mounded encapsulation 1006.

The second level 1010 of the mounded encapsulation 1006 comprises passive components 1028 but may be replaced with a thin die or a low profile package. Beneath the first level 1008 of the mounded encapsulation 1006 a first IC such as a first wire-bonded die 1030 with an active side 1032 is attached to the flexible circuit substrate 1002 with the die attach adhesive 1012.

The active side 1032 of the first wire-bonded die 1030 is connected to the flexible circuit substrate 1002 with the bond wires 1024. Above the first wire-bonded die 1030 is a second IC such as a second wire-bonded die 1034 with an active side 1036.

The active side 1036 of the second wire-bonded die 1034 is connected to the flexible circuit substrate 1002 with the bond wires 1024. Mounted below the flexible circuit substrate 1002 are external interconnects, such as the solder ball interconnects 1016.

Figure 11:
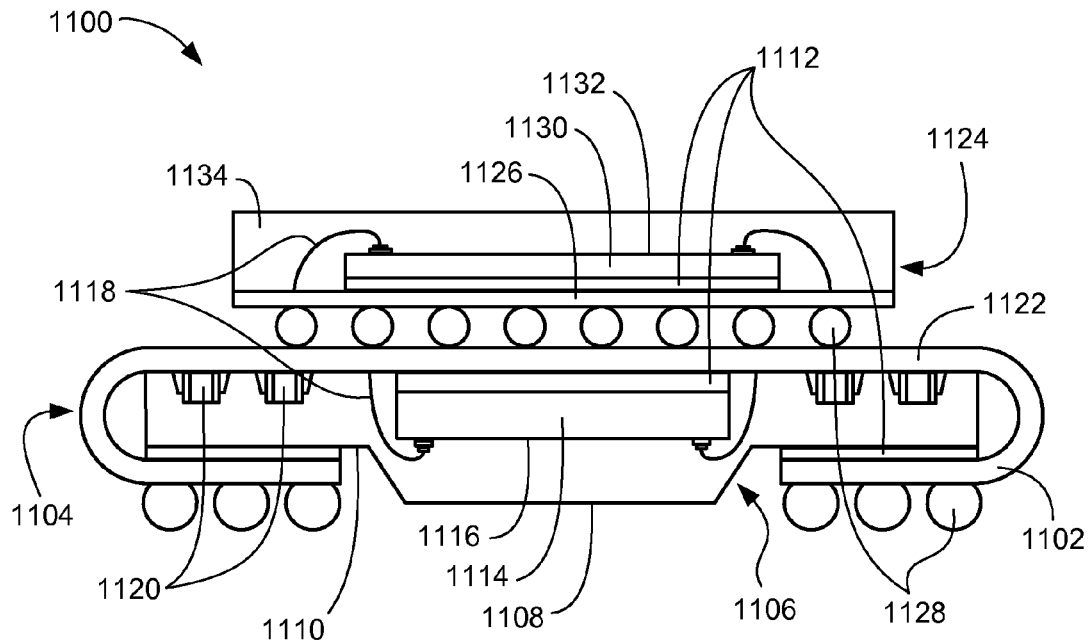
FIG. 11 is a cross-sectional view of an integrated circuit package system in accordance with a tenth embodiment of the present invention.

Referring now to FIG. 11, therein is shown a cross-sectional view of an integrated circuit package system 1100 in accordance with a tenth embodiment of the present invention. The integrated circuit package system 1100 is shown having a flexible circuit substrate 1102 with two folds 1104 folded around a mounded encapsulation 1106 that has been inverted.

The flexible circuit substrate 1102 comprises at least one flexible insulating layer, such as: polyimide (PI), polyester, polyethylene napthalate (PEN), Teflon, polyethylene terephthalate (PET), or other polymeric materials. The flexible circuit substrate 1102 also comprises at least one flexible conductive layer such as copper, aluminum, or metallic alloy. The flexible electrically conductive layer provides electrical connections between vias and various interconnects.

The mounded encapsulation 1106 has a first level 1108 and a second level 1110. The flexible circuit substrate 1102 is folded around the second level 1110 of the mounded encapsulation 1106. The flexible circuit substrate 1102 is attached to the second level 1110 with a die attach adhesive 1112. The flexible circuit substrate 1102 is sufficiently supported by the second level 1110.

Between the first level 1108 of the mounded encapsulation 1106 is an IC such as a wire-bonded die 1114 with an active side 1116. The wire-bonded die 1114 is connected to the flexible circuit substrate 1102 with the die attach adhesive 1112. The active side 1116 of the wire-bonded die 1114 is connected to the flexible circuit substrate 1102 with interconnects such as bond wires 1118.

The second level 1110 of the mounded encapsulation 1106 comprises passive components 1120 but may be replaced with a thin die or a low profile package. The flexible circuit substrate 1102 is shown having a base 1122. Mounted above the flexible circuit substrate 1102 is an integrated circuit package 1124 having a substrate 1126.

The substrate 1126 of the integrated circuit package 1124 is connected to the base 1122 of the flexible circuit substrate 1102 with interconnects such as solder ball interconnects 1128. Above the substrate 1126 is mounted a wire-bonded die 1130 with an active side 1132.

The active side 1132 is connected to the substrate 1126 with the bond wires 1118. The wire-bonded die 1130 is connected to the substrate 1126 with the die attach adhesive 1112.

An encapsulation 1134 encapsulates the wire-bonded die 1130. Mounted below the flexible circuit substrate 1102 and below the second level 1110 are external interconnects, such as the solder ball interconnects 1128.

Figure 12:
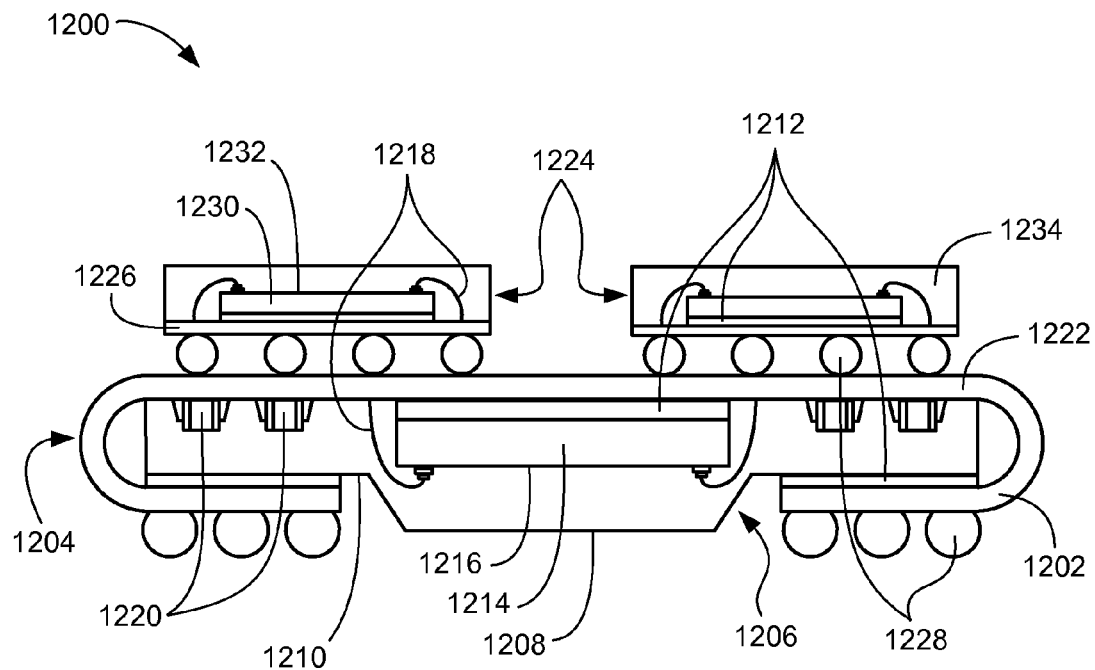
FIG. 12 is a cross-sectional view of an integrated circuit package system in accordance with an eleventh embodiment of the present invention.

Referring now to FIG. 12, therein is shown a cross-sectional view of an integrated circuit package system 1200 in accordance with an eleventh embodiment of the present invention. The integrated circuit package system 1200 is shown having a flexible circuit substrate 1202 with two folds 1204 folded around a mounded encapsulation 1206 that has been inverted.

The flexible circuit substrate 1202 comprises at least one flexible insulating layer, such as: polyimide (PI), polyester, polyethylene napthalate (PEN), Teflon, polyethylene terephthalate (PET), or other polymeric materials. The flexible circuit substrate 1202 also comprises at least one flexible conductive layer such as copper, aluminum, or metallic alloy. The flexible electrically conductive layer provides electrical connections between vias and various interconnects.

The mounded encapsulation 1206 has a first level 1208 and a second level 1210. The flexible circuit substrate 1202 is folded around the second level 1210 of the mounded encapsulation 1206. The flexible circuit substrate 1202 is attached to the second level 1210 with a die attach adhesive 1212. The flexible circuit substrate 1202 is sufficiently supported by the second level 1210.

Between the first level 1208 of the mounded encapsulation 1206 is an IC such as a wire-bonded die 1214 with an active side 1216. The wire-bonded die 1214 is connected to the flexible circuit substrate 1202 with the die attach adhesive 1212. The active side 1216 of the wire-bonded die 1214 is connected to the flexible circuit substrate 1202 with interconnects such as bond wires 1218.

The second level 1210 of the mounded encapsulation 1206 comprises passive components 1220 but may be replaced with a thin die or a low profile package. The flexible circuit substrate 1202 is shown having a base 1222. Mounted above the flexible circuit substrate 1202 are multiple integrated circuit packages 1224 having substrates 1226.

The substrates 1226 of the multiple integrated circuit packages 1224 are connected to the base 1222 of the flexible circuit substrate 1202 with interconnects such as solder ball interconnects 1228. Above the substrates 1226 are mounted wire-bonded dies 1230 with active sides 1232.

The active sides 1232 are connected to the substrates 1226 with the bond wires 1218. The wire-bonded dies 1230 are connected to the substrates 1226 with the die attach adhesive 1212. An encapsulation 1234 encapsulates the wire-bonded dies 1230. Mounted below the flexible circuit substrate 1202 and below the second level 1210 are external interconnects, such as the solder ball interconnects 1228.

Figure 13:
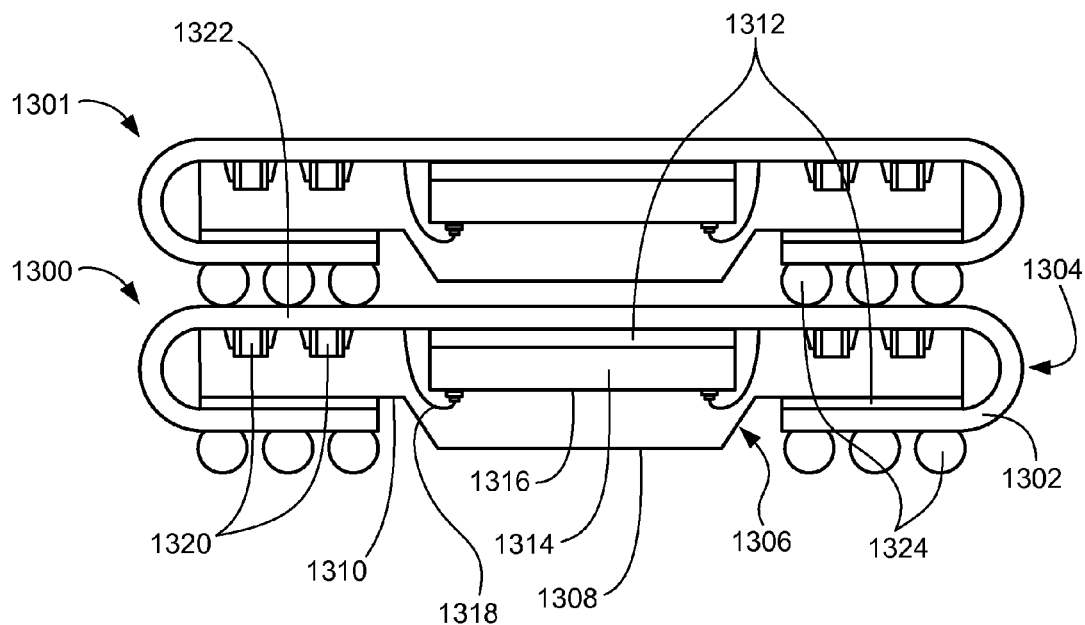
FIG. 13 is a cross-sectional view of an integrated circuit package system in accordance with a twelfth embodiment of the present invention.

Referring now to FIG. 13, therein is shown a cross-sectional view of an integrated circuit package system 1300 in accordance with a twelfth embodiment of the present invention. The integrated circuit package system 1300 is shown having a second integrated circuit package system 1301 stacked over the inverted integrated package system 1300. The second integrated circuit package system 1301 is shown as similar but may be comprised of different components to meet application specific needs. The integrated circuit package system 1300 is shown having a flexible circuit substrate 1302 with two folds 1304 folded around a mounded encapsulation 1306 that has been inverted.

The flexible circuit substrate 1302 comprises at least one flexible insulating layer, such as: polyimide (PI), polyester, polyethylene napthalate (PEN), Teflon, polyethylene terephthalate (PET), or other polymeric materials. The flexible circuit substrate 1302 also comprises at least one flexible conductive layer such as copper, aluminum, or metallic alloy. The flexible electrically conductive layer provides electrical connections between vias and various interconnects.

The mounded encapsulation 1306 has a first level 1308 and a second level 1310. The flexible circuit substrate 1302 is folded around the second level 1310 of the mounded encapsulation 1306. The flexible circuit substrate 1302 is attached to the second level 1310 with a die attach adhesive 1312. The flexible circuit substrate 1302 is sufficiently supported by the second level 1310.

Between the first level 1308 of the mounded encapsulation 1306 is an IC such as a wire-bonded die 1314 with an active side 1316. The wire-bonded die 1314 is connected to the flexible circuit substrate 1302 with the die attach adhesive 1312.

The active side 1316 of the wire-bonded die 1314 is connected to the flexible circuit substrate 1302 with interconnects such as bond wires 1318. The second level 1310 of the mounded encapsulation 1306 comprises passive components 1320 but may be replaced with a thin die or a low profile package.

The flexible circuit substrate 1302 further comprises a base 1322 to which second integrated circuit package system 1301 may be mounted. Mounted below the flexible circuit substrate 1302 and below the second level 1310 are external interconnects, such as the solder ball interconnects 1324. The second integrated circuit package system 1301 are connected with the solder ball interconnects 1324.

Figure 14:
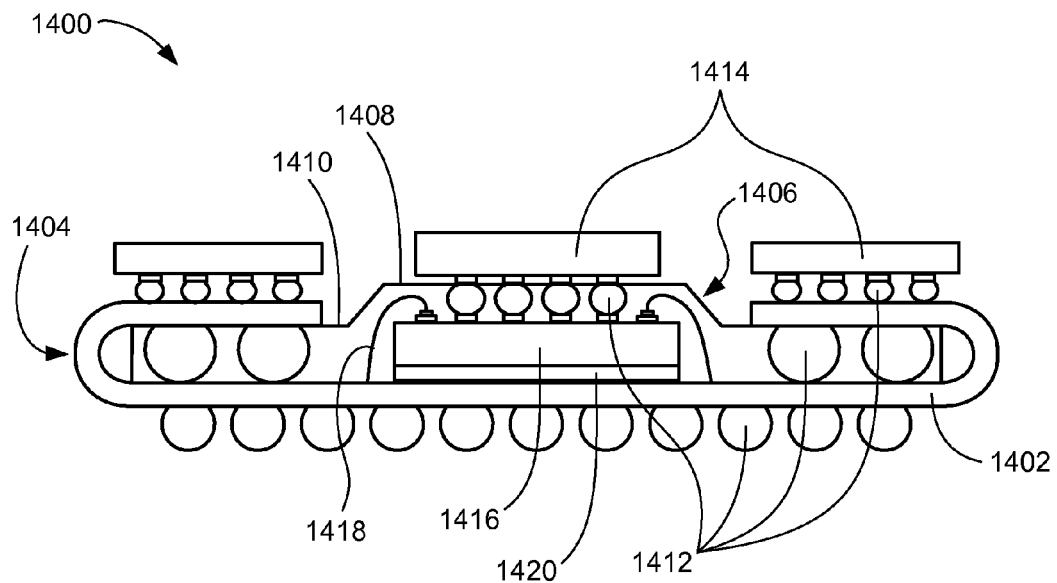
FIG. 14 is a cross-sectional view of an integrated circuit package system in accordance with a thirteenth embodiment of the present invention.

Referring now to FIG. 14, therein is shown a cross-sectional view of an integrated circuit package system 1400 in accordance with a thirteenth embodiment of the present invention. The integrated circuit package system 1400 is shown having a flexible circuit substrate 1402 with two folds 1404 folded around a mounded encapsulation 1406.

The flexible circuit substrate 1402 comprises at least one flexible insulating layer, such as: polyimide (PI), polyester, polyethylene napthalate (PEN), Teflon, polyethylene terephthalate (PET), or other polymeric materials. The flexible circuit substrate 1402 also comprises at least one flexible conductive layer such as copper, aluminum, or metallic alloy. The flexible electrically conductive layer provides electrical connections between vias and various interconnects.

The mounded encapsulation 1406 has a first level 1408 and a second level 1410. The flexible circuit substrate 1402 is folded around the second level 1410 of the mounded encapsulation 1406.

The flexible circuit substrate 1402 directly contacts the second level 1410 of the mounded encapsulation 1406 and is sufficiently supported by the second level 1410. The second level 1410 of the mounded encapsulation 1406 comprises internal interconnects such as solder ball interconnects 1412.

The solder ball interconnects 1412 are partially exposed to provide electrical connection through the second level 1410 of the mounded encapsulation 1406. Mounted above the second level 1410 and above the first level 1408 of the mounded encapsulation 1406 are IC packages 1414 such as wafer level chip scale package (WLCSP), redistributed line (RDL) die, area array package, leadless package, leaded package, system-in-package (SiP), stacked die package, package-in-package (PiP), etc.

The IC packages 1414 are mounted above the flexible circuit substrate 1402 and the second level 1410 of the mounded encapsulation 1406. The IC packages 1414 above the second level 1410 are connected to the flexible circuit substrate 1402 with the solder ball interconnects 1412 in a ball grid array (BGA) configuration.

Beneath the first level 1408 of the mounded encapsulation 1406 an IC package 1416 is attached to the flexible circuit substrate 1402 with the die attach adhesive 1420. The IC package 1416 is connected from above to the flexible circuit substrate 1402 with bond wires 1418. The IC package 1416 is further connected from above with the solder ball interconnects 1412.

The solder ball interconnects 1412 are exposed on the first level 1408 of the mounded encapsulation 1406. The mounded encapsulation 1406 can serve as an under-fill material that can structurally reinforce the solder ball interconnects 1412 to improve the fatigue life and reliability.

The IC packages 1414 above the first level 1408 is connected to the solder ball interconnects 1412 above the IC package 1416. Mounted below the flexible circuit substrate 1402 are external interconnects, such as the solder ball interconnects 1412.

Figure 15:
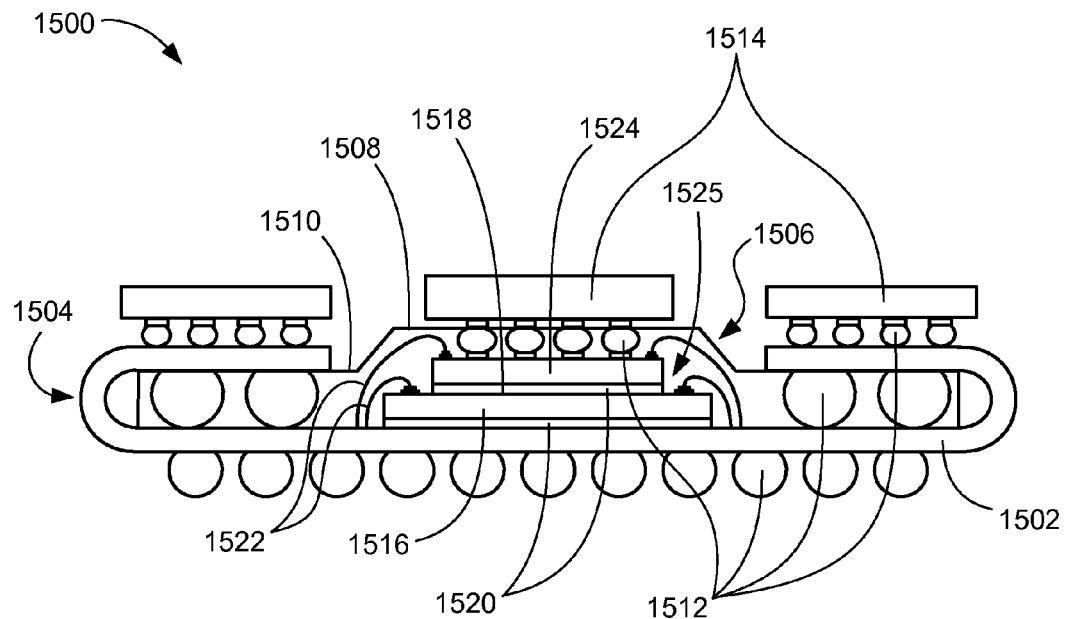
FIG. 15 is a cross-sectional view of an integrated circuit package system in accordance with a fourteenth embodiment of the present invention.

Referring now to FIG. 15, therein is shown a cross-sectional view of an integrated circuit package system 1500 in accordance with a fourteenth embodiment of the present invention. The integrated circuit package system 1500 is shown having a flexible circuit substrate 1502 with two folds 1504 folded around a mounded encapsulation 1506.

The flexible circuit substrate 1502 comprises at least one flexible insulating layer, such as: polyimide (PI), polyester, polyethylene napthalate (PEN), Teflon, polyethylene terephthalate (PET), or other polymeric materials. The flexible circuit substrate 1502 also comprises at least one flexible conductive layer such as copper, aluminum, or metallic alloy. The flexible electrically conductive layer provides electrical connections between vias and various interconnects.

The mounded encapsulation 1506 has a first level 1508 and a second level 1510. The flexible circuit substrate 1502 is folded around the second level 1510 of the mounded encapsulation 1506. The flexible circuit substrate 1502 directly contacts the second level 1510 of the mounded encapsulation 1506 and is sufficiently supported by the second level 1510.

The second level 1510 of the mounded encapsulation 1506 comprises internal interconnects such as solder ball interconnects 1512. The solder ball interconnects 1512 are partially exposed to provide electrical connection through the second level 1510 of the mounded encapsulation 1506.

Mounted above the second level 1510 and above the first level 1508 of the mounded encapsulation 1506 are IC packages 1514 such as wafer level chip scale package (WLCSP), redistributed line (RDL) die, area array package, leadless package, leaded package, system-in-package (SiP), stacked die package, package-in-package (PiP), etc.

The IC packages 1514 are mounted above the flexible circuit substrate 1502 and the second level 1510 of the mounded encapsulation 1506. The IC packages 1514 above the second level 1510 are connected to the flexible circuit substrate 1502 with the solder ball interconnects 1512 in a ball grid array (BGA) configuration.

Beneath the first level 1508 of the mounded encapsulation 1506 a wire-bonded die 1516 with an active side 1518 is attached to the flexible circuit substrate 1502 with a die attach adhesive 1520.

The active side 1518 of the wire-bonded die 1516 is connected to the flexible circuit substrate 1502 by interconnects such as bond wires 1522. Mounted above the wire-bonded die 1516 is an IC package 1524 such as a wafer level chip scale package (WLCSP), a redistributed line (RDL) die, or an area array package. The wire-bonded die 1516 and the IC package 1524 are a combination 1525 and the IC package 1524 is attached to the active side 1518 of the wire-bonded die 1516 with the die attach adhesive 1520.

The IC package 1524 is connected to the flexible circuit substrate 1502 by the bond wires 1522. The IC package 1524 is connected with the solder ball interconnects 1512 to the IC packages 1514 mounted above the first level 1508 of the mounded encapsulation 1506.

The mounded encapsulation 1506 can serve as an under-fill material that can structurally reinforce the solder ball interconnects 1512 to improve the fatigue life and reliability. Mounted below the flexible circuit substrate 1502 are external interconnects, such as the solder ball interconnects 1512.

Figure 16:
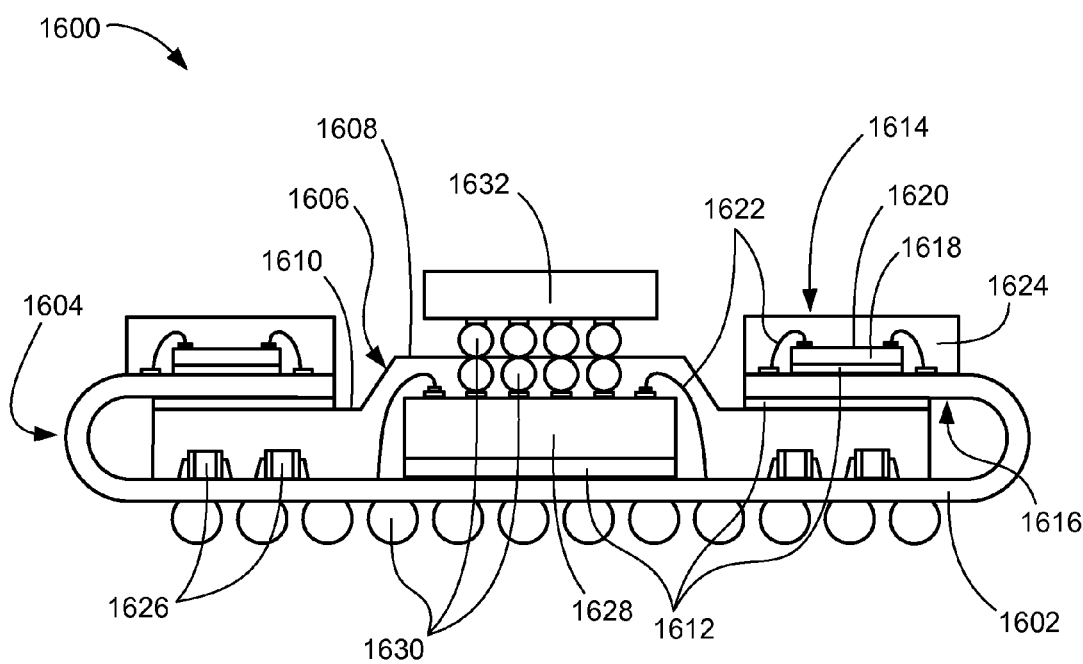
FIG. 16 is a cross-sectional view of an integrated circuit package system in accordance with a fifteenth embodiment of the present invention.

Referring now to FIG. 16, therein is shown a cross-sectional view of an integrated circuit package system 1600 in accordance with a fifteenth embodiment of the present invention. The integrated circuit package system 1600 is shown having a flexible circuit substrate 1602 with two folds 1604 folded around a mounded encapsulation 1606.

The flexible circuit substrate 1602 comprises at least one flexible insulating layer, such as: polyimide (PI), polyester, polyethylene napthalate (PEN), Teflon, polyethylene terephthalate (PET), or other polymeric materials. The flexible circuit substrate 1602 also comprises at least one flexible conductive layer such as copper, aluminum, or metallic alloy. The flexible electrically conductive layer provides electrical connections between vias and various interconnects.

The mounded encapsulation 1606 has a first level 1608 and a second level 1610. The flexible circuit substrate 1602 is folded around the second level 1610 of the mounded encapsulation 1606.

The flexible circuit substrate 1602 is sufficiently supported by the second level 1610 and is attached to the second level 1610 with a die attach adhesive 1612. Above the flexible circuit substrate 1602 and the second level 1610, IC packages 1614 are mounted face up and may be mounted with an overhang 1616.

The IC packages 1614 may be replaced with a wafer level chip scale package (WLCSP), redistributed line (RDL) die, area array package, leadless package, leaded package, system-in-package (SiP), stacked die package, package-in-package (PiP), etc.

Internally, the IC packages 1614 include a wire-bonded die 1618 with an active side 1620. The active side 1620 is facing away from the second level 1610 of the mounded encapsulation 1606 and is connected to the flexible circuit substrate 1602 with interconnects such as bond wires 1622.

The wire-bonded die 1618 is attached to the flexible circuit substrate 1602 with the die attach adhesive 1612. An encapsulation 1624 encapsulates the wire-bonded die 1618 and the bond wires 1622.

The second level 1610 of the mounded encapsulation 1606 comprises passive components 1626 but may be replaced with a thin die or a low profile package. The passive components 1626 may also be mounted on the two folds 1604. Beneath the first level 1608 of the mounded encapsulation 1606 an IC package 1628 is attached to the flexible circuit substrate 1602 with the die attach adhesive 1612.

The IC package 1628 is connected from above to the flexible circuit substrate 1602 with the bond wires 1622. The IC package 1628 is further connected from above with interconnects such as solder ball interconnects 1630.

The solder ball interconnects 1630 are exposed on the first level 1608 of the mounded encapsulation 1606. The mounded encapsulation 1606 can serve as an under-fill material that can structurally reinforce the solder ball interconnects 1630 to improve the fatigue life and reliability.

Mounted above the first level 1608 is an IC such as a flip chip (FC) 1632 but may also be a wafer level chip scale package (WLCSP), a redistributed line (RDL) die, or an area array package.

The FC 1632 is connected with the solder ball interconnects 1630 to the first level 1608 of the mounded encapsulation 1606 and to the solder ball interconnects 1630 above the IC package 1628. Mounted below the flexible circuit substrate 1602 are external interconnects, such as the solder ball interconnects 1630.

Figure 17:
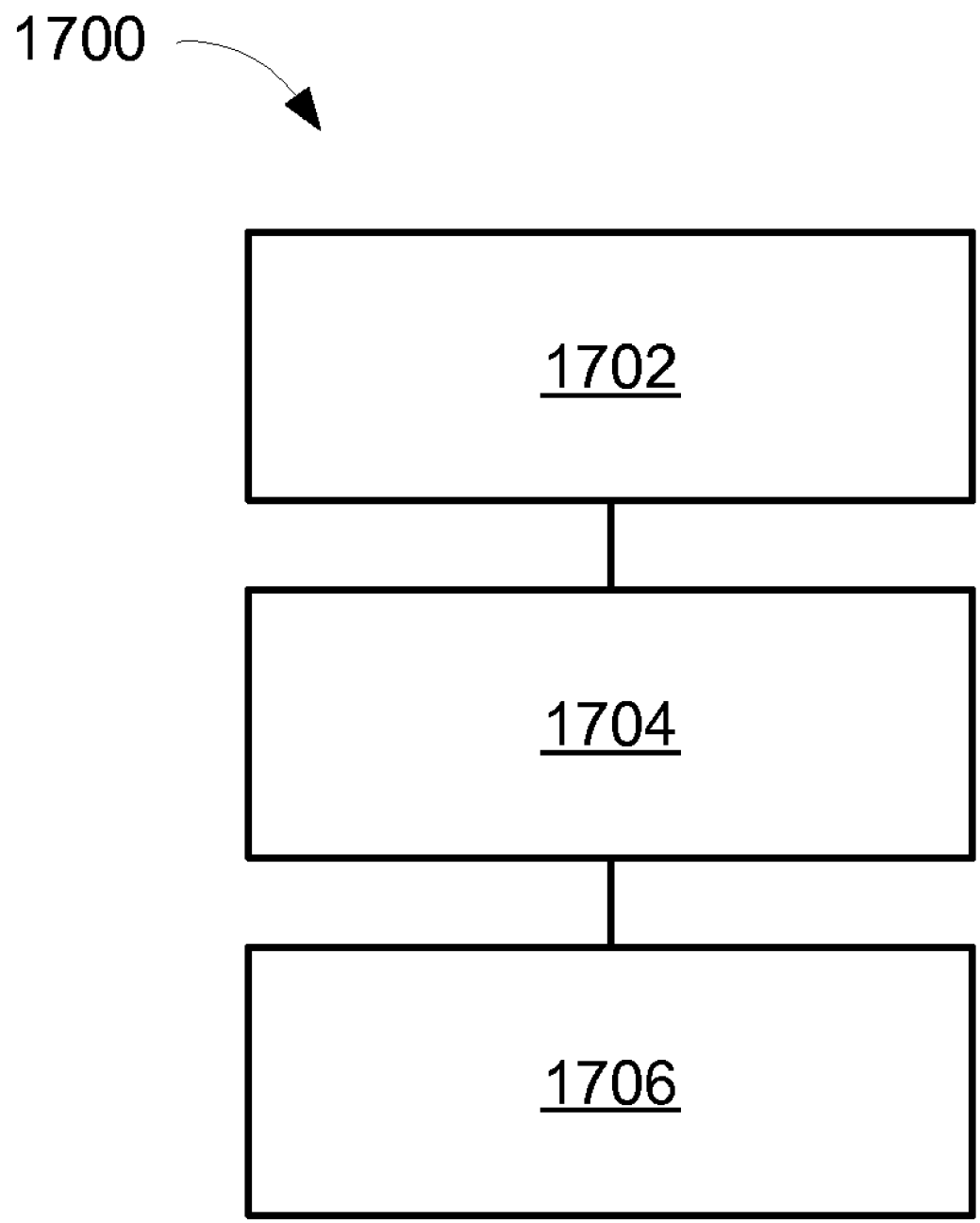
FIG. 17 is a flow chart of an integrated circuit package system for manufacture of an integrated circuit package system in an embodiment of the present invention.

Referring now to FIG. 17, therein is shown a flow chart of a system 1700 for manufacturing the integrated circuit package system 100. The system 1700 includes providing an integrated circuit package system including: providing a flexible circuit substrate in a block 1702; mounting an integrated circuit or an integrated circuit package over the flexible circuit substrate and connected to the flexible circuit substrate with interconnects in a block 1704; and encapsulating the integrated circuit or integrated circuit package with a mounded encapsulation having a first level and a second level, the second level having the flexible circuit substrate folded thereover in a block 1706.

While the invention has been described in conjunction with a specific best mode, it is to be understood that many alternatives, modifications, and variations will be apparent to those skilled in the art in light of the aforegoing description.

Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacturing of an integrated circuit package system comprising: providing a flexible circuit substrate; mounting an integrated circuit or an integrated circuit package over the flexible circuit substrate and connected to the flexible circuit substrate with interconnects; and encapsulating the integrated circuit or integrated circuit package with a mounded encapsulation having a first level and a second level, the second level having the flexible circuit substrate folded thereover.

2. The method as claimed in claim 1 wherein: encapsulating with the mounded encapsulation includes encapsulating with the mounded encapsulation having a first level in an offset.

3. The method as claimed in claim 1 wherein:
   providing the flexible circuit substrate includes providing the flexible circuit substrate with a base and mounting an integrated circuit package, or a second integrated circuit package system thereto.

4. The method as claimed in claim 1 wherein:
   mounting the integrated circuit package includes mounting the integrated circuit package above the first level and connected to the flexible circuit substrate above the second level with solder ball interconnects.

5. The method as claimed in claim 1 further comprising:
   mounting a passive component on a fold of the flexible circuit substrate or above the flexible circuit substrate.

6. A method of manufacturing of an integrated circuit package system comprising:
   providing a flexible circuit substrate with a substrate window; mounting an integrated circuit or an integrated circuit package over the flexible circuit substrate and connected to the flexible circuit substrate with interconnects; encapsulating the integrated circuit or integrated circuit package with a mounded encapsulation having a first level and a second level; folding the flexible circuit substrate over the second level and the first level is in the substrate window; and
   mounting a second integrated circuit, or a second integrated circuit package above the second level of the mounded encapsulation and connected to the flexible circuit substrate.

7. The method as claimed in claim 6 wherein: mounting the integrated circuit or the integrated circuit package over the flexible circuit substrate includes mounting a wire-bonded die, a flip chip, an integrated circuit package, or a combination thereof over the flexible circuit substrate.

8. The method as claimed in claim 6 wherein: mounting the integrated circuit over the flexible circuit substrate includes mounting a flip chip over the flexible circuit substrate and exposed from the first level of the mounded encapsulation.

9. The method as claimed in claim 6 wherein:
mounting the second integrated circuit, or the second integrated circuit package above the second level of the mounded encapsulation includes mounting the second integrated circuit, or the second integrated circuit package with an overhang.

10. The method as claimed in claim 6 wherein: folding the flexible circuit substrate over the second level includes: connecting the flexible circuit substrate directly to the second level;
attaching the flexible circuit substrate to the second level with die attach adhesive; or folding the flexible circuit substrate over the second level and over the integrated circuit package.

11. An integrated circuit package system comprising:
a flexible circuit substrate;
an integrated circuit or an integrated circuit package mounted over the flexible circuit substrate and connected to the flexible circuit substrate with interconnects; and
a mounded encapsulation encapsulating the integrated circuit or integrated circuit package having a first level and a second level, the second level having the flexible circuit substrate folded thereover.

12. The system as claimed in claim 11 wherein: the mounded encapsulation includes a first level in an offset.

13. The system as claimed in claim 11 wherein:
the flexible circuit substrate has a base and an integrated circuit package, or a second integrated circuit package system is mounted thereto.

14. The system as claimed in claim 11 wherein: the integrated circuit package is mounted above the first level and connected to the flexible circuit substrate above the second level with solder ball interconnects.

15. The system as claimed in claim 11 further comprising: a passive component mounted on a fold of the flexible circuit substrate or above the flexible circuit substrate.

16. The system as claimed in claim 11 further comprising: a substrate window having the first level of the molded encapsulation therein; and wherein: a second integrated circuit, or a second integrated circuit package is mounted above the second level of the mounded encapsulation and connected to the flexible circuit substrate.

17. The system as claimed in claim 16 wherein: the integrated circuit or the integrated circuit package includes a wire-bonded die, a flip chip, an integrated circuit package, or a combination thereof over the flexible circuit substrate.

18. The system as claimed in claim 16 wherein: the integrated circuit mounted over the flexible circuit substrate is a flip chip over the flexible circuit substrate and exposed from the first level of the mounded encapsulation.

19. The system as claimed in claim 16 wherein: the second integrated circuit, or the second integrated circuit package includes the second integrated circuit, or the second integrated circuit package with an overhang.

20. The system as claimed in claim 16 wherein: the flexible circuit substrate folded over the second level is: connected directly to the second level; attached to the second level with die attach adhesive; or folded over the second level and over the integrated circuit package.

* * * * *